(12) United States Patent
Card et al.

(10) Patent No.: US 8,288,266 B2
(45) Date of Patent: Oct. 16, 2012

(54) CIRCUITIZED SUBSTRATE ASSEMBLY

(75) Inventors: Norman A. Card, Lockwood, NY (US); Richard A. Day, Whitney Point, NY (US); John J. Konrad, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1055 days.

(21) Appl. No.: 11/500,328

(22) Filed: Aug. 8, 2006

(65) Prior Publication Data

US 2008/0038670 A1 Feb. 14, 2008

(51) Int. Cl.
*H01L 21/44* (2006.01)
(52) U.S. Cl. .................................................. 438/613
(58) Field of Classification Search .................. 430/311; 438/613; 427/97.2; 174/68.1
See application file for complete search history.

(56) References Cited

U.S. PATENT DOCUMENTS

| | | | |
|---|---|---|---|
| 3,628,999 A | 12/1971 | Schneble, Jr. et al. | |
| 4,487,828 A | 12/1984 | Hladovcak et al. | |
| 4,506,004 A | 3/1985 | Sullivan | |
| 4,624,912 A | 11/1986 | Zweifel et al. | |
| 4,668,603 A | 5/1987 | Taylor, Jr. | |
| 4,966,827 A | 10/1990 | Sullivan | |
| 5,300,402 A | 4/1994 | Card, Jr. et al. | |
| 5,439,779 A | 8/1995 | Day et al. | |
| 5,798,285 A | 8/1998 | Bentlage et al. | |
| 5,863,597 A | 1/1999 | Lynch | |
| 6,210,862 B1 | 4/2001 | Day et al. | |
| 2003/0056365 A1* | 3/2003 | Boggs et al. | 29/825 |
| 2003/0162379 A1* | 8/2003 | Tong et al. | 438/613 |
| 2004/0092174 A1* | 5/2004 | Eichorn et al. | 439/876 |
| 2005/0074924 A1* | 4/2005 | Antesberger et al. | 438/128 |

* cited by examiner

*Primary Examiner* — Brittany Raymond
(74) *Attorney, Agent, or Firm* — Mark Levy; Hinman, Howard & Kattell, LLP; Lawrence R. Fraley

(57) ABSTRACT

A method of making a circuitized substrate in which the substrate includes circuit elements having exposed surfaces defined by two thin layers of permanent photoimaged solder mask material which are applied through fine mesh screens. The use of two thin layers assures effective coverage of the material to precisely expose the desired surfaces in high-density circuit patterns. A circuitized substrate assembly and an information handling system adapted for having one or more such assemblies therein are also provided.

11 Claims, 3 Drawing Sheets

CIRCUITIZED SUBSTRATE ASSEMBLY

TECHNICAL FIELD

The invention relates to the manufacture of circuitized substrates (e.g., printed circuit boards, chip carriers and the like) which involves the application of solder mask materials onto the substrates prior to deposition of solder onto the non-protected circuit patterns (elements) on the substrate. Even more particularly, the invention relates to such applications wherein the solder mask is of the photoimageable type and is applied in liquid form.

BACKGROUND OF THE INVENTION

The use of solder mask material in the formation of printed circuit boards (hereinafter also referred to as PCB's), chip carriers and other circuitized substrate products is well known. Solder mask is typically applied over the substrate's exposed surface circuitry prior to the components being soldered to the substrate, and may be applied to one or both exposed surfaces (the latter if opposite sides are being populated with components). Solder mask materials include the photoimagable type, sometimes in liquid form, with various examples including the Valu-SMT® series of materials sold by E.I. duPont de Nemours and Company and the Probimer.® solder mask series of materials sold by Huntsman Advanced Materials Corporation. As is known, these materials provide dielectric and mechanical protection of the circuitry during and after soldering operations. Typically, the solder mask may be applied uniformly over the circuitry (e.g., copper "traces") in single layer form, using curtain coating, screen coating, spray coating and roller coating procedures, all of which are known in the art as well as the various apparatus for performing same. A mesh screen may be utilized for screen coating, for example. A substrate which has been coated with the single layer of liquid photoimagable solder mask is then typically set into a chamber, where it is exposed to ultraviolet (UV) light which cures the liquid material. Preferably, the cured solder mask exhibits no visible cracks, scratches, or other surface defects even after the soldering processes which attach either the surface mount technology (SMT) components or the plated through hole (PTH) components to the substrate's upper surface.

It is necessary that the solder mask material be formulated such that it possesses rheological properties for effective coating. Further, the solder mask must permit efficient transmission of the light or other (e.g., UV) exposing radiation so as to photolyze the photoinitiator through whatever thickness of material is applied. Also, of course, the solder mask must possess appropriate physical and chemical properties to withstand the application of the solder without significant deterioration or degradation and maintain its coverage over the portions of the board wherein solder is to be masked.

Conventional photoimageable solder mask materials, including those of the aforementioned liquid type, typically contain about 30-80% solids in solvents, such as naphtha, propylene glycol monomethyl ether, diglyme, and/or propylene glycol monomethyl ether acetate. These solder mask materials also require organic solvents to apply the mask to a substrate and to develop the deposited material. Some of these organic solvents tend to evaporate and are lost to the environment. Of the total solvent lost to the environment, approximately 85-95% is typically lost during the application process and another approximately 5-15% is lost during the developing steps. Of more recent vintage, solder mask materials have been devised that are designated "aqueous" solder mask materials. While these are developed using aqueous solvents, these are nevertheless applied using organic solvents. The use of such aqueous solder masks reduces the solvent loss associated with the non-aqueous types by only about 5-15%. In contrast, a solder mask that is applied using an aqueous solvent, even though developed using an organic solvent, would reduce the overall organic solvent emissions by about 85-95%.

Examples of various photoimageable solder mask materials and various processes involving the use of solder masks are described in the following U.S. Letters Patents.

In U.S. Pat. No. 6,210,862, there is described a photoimagable cationically polymerizable epoxy based solder mask that contains a non-brominated epoxy resin system and from about 0.1 to about 15 parts, by weight per 100 parts of resin system, of a cationic photoinitiator. The non-brominated epoxy-resin system has solids that are comprised of from about 10% to about 80% by weight, of a polyol resin having epoxy functionality; from about 0% to about 90% by weight of a polyepoxy resin; and from about 25% to about 85% by weight of an difunctional epoxy resin. Since the photosensitive cationically polymerizable epoxy based solder mask does not contain bromine, it is particularly advantageous in waste processing in incineration of waste circuit boards. The photosensitive cationically polymerizable non-brominated epoxy based solder mask has a glass transition temperature greater than about 100.degrees C., and preferably greater than about 110.degrees C. The solder mask dries to a tack-free film; thus, artwork used in the photoimaging process will not stick to the dried soldermask film. The polyol resin which is a condensation product of epichlorohydrin and bisphenol A, has a weight average molecular weight of between about 40,000 and 130,000. The polyepoxy resin is an epoxidized multi-functional bisphenol A formaldehyde novolak resin having a weight average molecular weight of 4,000 to 10,000. The epoxidized diglycidyl ether of bisphenol A has two epoxide groups per molecule, a melting point of between about 80.degrees C. and about 110.degrees C. and a weight average molecular weight of between about 600 and 2,500.

In U.S. Pat. No. 5,863,597, there is described a cost-effective process for preventing mealing of a polyurethane conformal coating applied to a printed wiring board is described. The process includes utilizing a liquid photo-imagable solder mask for protecting the circuitry within the board prior to applying the polyurethane conformal coating. The process further includes applying the polyurethane coating within a controlled maximum thickness of 0.0015 inches for preventing vesication of the conformal coating.

In U.S. Pat. No. 5,798,285, there is described the application of a first plating resist for forming circuit lines on a carrier substrate. While the plating resist is still in place, a metal, such as nickel, is deposited on top of the circuit lines. A second plating resist is employed for plating solder on the circuit lines at solder sites. At this stage, additional solder can be deposited at each solder site to provide or supplement the necessary low melt solder required for forming a solder joint. The first and second resists along with solder thereon are then stripped and copper foil on the carrier substrate is etched away around the circuit lines. A solder mask is then formed on the carrier substrate over the circuit lines except for circuit lines in the chip sites. The solder mask has a single large opening at each chip site which has lateral dimensions which are slightly larger than the lateral dimensions of the chip to be connected at the chip site. During curing of the solder mask, which involves heat, the nickel layer on top of the circuit lines within the chip site opening quickly oxidizes to provide solder dams which extend along the lengths of the lines within the chip site openings immediately adjacent the solder sites. The chips are then placed within the solder mask windows and electrically connected by solder joints to the solder sites of the circuit lines by a flip chip attach method. The chip sites are then encapsulated with an under-fill encapsulant to protect the solder joints.

In U.S. Pat. No. 5,439,779, there is described a photoimageable solder mask of the aforementioned aqueous type; that is, one that may be applied using aqueous solvents, thereby reducing the emission of organic solvents. The solder mask contains an epoxy based resin system comprised of at least one epoxy resin, a coating agent, and preferably a cationic photoinitiator and a dye.

In U.S. Pat. No. 5,300,402, there is described a photoimagable cationically polymerizable epoxy based coating material which includes an epoxy resin system consisting essentially of between about 10% and about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolak resin having a molecular weight of 4,000 to 10,000; and if flame retardancy is required, between about 35% and 50% by weight of an epoxidized glycidyl ether of tetrabromo bisphenol A having a softening point of between about 60 C. and about 110 C. and a molecular weight of between about 600 and 2,500. To this resin system is added about 0.1 to about 15 parts by weight per 100 parts of resin of a cationic photoinitiator capable of initiating polymerization of said epoxidized resin system upon exposure to actinic radiation; the system being further characterized by having an absorbance of light in the 330 to 700 nm region of less than 0.1 for a 2.0 mil thick film, and an effective amount of thixatropic agent. Optionally a photosensitizer such as perylene and its derivatives or anthracene and its derivatives may be added.

In U.S. Pat. No. 4,668,603, a solder mask is first applied to a printed circuit board which contains a raised relief due to the conductive areas and nonconductive areas, the solder mask being a negative acting solder mask layer and applied using vacuum lamination. Thereafter, the photosensitive solder mask film is image-wise exposed to actinic radiation with unexposed areas of the film washed away to expose portions of the substrate which are conductive. Thereafter a substrate surface typically is exposed to a molten wave of solder with solidification onto exposed conductive portions of the substrate without obtaining any adhering coating on the solder mask.

In U.S. Pat. No. 4,624,912, there is described a process for the production of a protective layer or a relief image on a substrate, wherein a radiation-sensitive layer, consisting of a solid film-forming epoxy resin containing a photoinitiator, which can be activated by radiation, for the polyaddition reaction, is transferred from a support to a substrate, then exposed directly or under a photomask and hardened by the action of heat, after which, if appropriate, the unexposed parts are developed with a solvent. The process is suitable, for example, for the production of printed circuits, solder resist masks and offset printing plates.

In U.S. Pat. No. 4,506,004, there is described the application of a two layer coating of solder mask. One inner adhesive photopolymer layer is applied to a PCB in the liquid state, displacing air from the PCB's surface. The outer layer of the composite is dry and is carried on a thin plastic sheet and over-laminated onto the liquid inner layer, without the need for a vacuum laminator. The dry film solder mask so laminated is then exposed through a photo-transparency to harden the light struck dry film solder mask and light struck inner layer photopolymer, thereby co-joining the dry film solder mask, inner layer and PCB surface. A solvent washout step removes unexposed dry film solder mask and unexposed inner layer photopolymer. The composite coating can be a combination of known solder mask materials, dry film, UV-curable and thermal-curing epoxy. U.S. Pat. No. 4,966,827 is similar in such teachings.

In U.S. Pat. No. 4,487,828, there is described a method for manufacturing a printed wiring board having a solder layer existing on circuit paths located on surfaces of the board and a solder layer on the walls of thru holes located in the board. The method involves coating the surface of the board with a layer of photopolymer resist. A shield is placed over selected areas of the solder layer on the surface and the shielded surface is exposed to ultra violet light until the unshielded resist hardens. The shielded resist which has remained soft is removed and the board is washed with solder resist to remove the solder layer not covered by a coating of hardened resist.

Finally, in U.S. Pat. No. 3,628,999, there is described a method for producing printed circuit boards which includes the application of a temporary, strippable solder mask together with a permanent solder mask.

Understandably, there are several other photoimageable solder mask materials and processes utilizing same known in the art than those described above. The above listing is, therefore, not meant to be exhaustive.

It has been determined that the single layer application of liquid photoimageable solder mask material to circuit patterns of high density may result in a failure of the material on some occasions to adequately contact some parts of the circuit (especially those of "taller" configurations). This is believed the result of various factors, including the aforementioned solids in the solvent, dyes and pigments (for imparting desired color), the mesh of the screen utilized, various flow modifiers, etc. For circuit patterns of lesser density, this has not often presented a serious problem. However, for high-density circuit patterns required in many of today's products, a more satisfactory procedure is deemed necessary.

It is believed, therefore, that a process for applying photoimageable solder mask material in a manner that will assure effective coverage of circuit elements in a high-density pattern of such elements of different heights (thicknesses) would represent a significant advancement in the art.

OBJECTS AND SUMMARY OF THE INVENTION

It is, therefore, a primary object of this invention to enhance the circuitized substrate art and particularly that part of the art relating to the manufacture of such substrates.

It is another object of the invention to provide a method of applying solder mask material which represents a significant improvement over known methodologies.

It is another object of the invention to provide such a method which may be performed in an expeditious, yet relatively inexpensive manner, thus making said method adaptable to mass production.

According to one aspect of the invention, there is provided a method of making a circuitized substrate comprising providing a substrate having a first surface with circuit elements thereon, applying a first layer of photoimageable solder mask material through a fine mesh screen onto the substrate to substantially cover the circuit elements, at least partly drying this first layer of photoimageable solder mask material, applying a second layer of photoimageable solder mask material through a fine mesh screen onto the first layer of photoimageable solder mask material, at least partly drying the second layer of photoimageable solder mask material, exposing and developing preselected areas of the photoimageable solder mask material over the circuit elements to remove the preselected areas and thereby expose corresponding parts of the circuit elements, and thereafter thermally curing the remaining portions of the photoimageable solder mask material.

According to another aspect of the invention, there is provided a circuitized substrate assembly comprising a substrate including a first surface, circuit elements on the first surface of the substrate, first and second thin layers of permanent photoimaged solder mask material on the first surface of the substrate and defining a plurality of openings therein which expose parts of the circuit elements, this second thin layer of permanent photoimaged solder mask material being positioned over the first thin layer of permanent photoimaged solder mask material, a solder element secured to selected ones of the exposed parts of the circuit elements, and an electronic component electrically coupled to selected ones of these solder elements so as to electrically couple the electronic component to the selected ones of the circuit elements.

According to yet another aspect of the invention, there is provided an information handling system comprising a housing and a circuitized substrate assembly positioned within the housing, this circuitized substrate assembly including a substrate including a first surface, circuit elements on the first surface, first and second thin layers of permanent photoimaged solder mask material on the first surface and defining a plurality of openings therein which expose parts of the circuit elements, the second thin layer of permanent photoimaged solder mask material being positioned over the first thin layer of permanent photoimaged solder mask material, a solder element secured to selected ones of the exposed parts of the circuit elements, and an electronic component electrically coupled to selected ones of the solder elements so as to electrically couple the electronic component to the selected ones of circuit elements.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. 2 to FIG. 6.

By the term "circuitized substrate" as used herein is meant to include a substrate which includes at least one dielectric layer and a plurality of circuit elements on a surface of the at least one dielectric layer. One example of such a substrate is a printed circuit board (PCB), which may include several dielectric and conductive layers as part thereof. The circuit elements are usually several in number and may comprise circuit lines, pads and the like, as well as the upper land portions of plated through holes, all such elements forming one of the conductive layers (the "barrels" of the plated through holes of course extending within the dielectric from the conductive layer's plane). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, alumina ceramics, glass ceramics, low temperature co-fired ceramics, and other like materials wherein the circuit elements are usually comprised of sound conductive material such as copper, but may include or comprise additional metals (e.g., nickel, silver, gold, molybdenum, aluminum, etc.) or alloys thereof. The layer which these circuit elements occupy may be referred to as a signal, ground or power layer, depending on the element configurations. In the case of some power layers (or planes) the conductive layer may be substantially solid conductive material (usually copper) for a major portion thereof. Another example of such a circuitized substrate is a chip carrier, which may also be made of some of the foregoing materials.

By the term "fine mesh" to define the screens used herein is meant screens of about 150 mesh or greater.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

By the term "tack dried" as used herein is meant the drying of the surface(s) of the applied photoimageable solder mask material to the extent that the surface of the material is dry to the touch and will not stick to other objects. Further drying is considered necessary for final use of the material in the products defined herein.

Figure 1A:
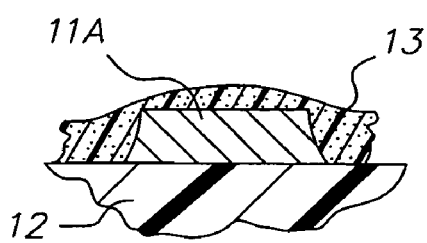
FIGS. 1A and 1B illustrate different height circuit elements on a substrate onto which has been applied a typical, single layer of liquid photoimageable solder mask material of the prior art.
Figure 1B:
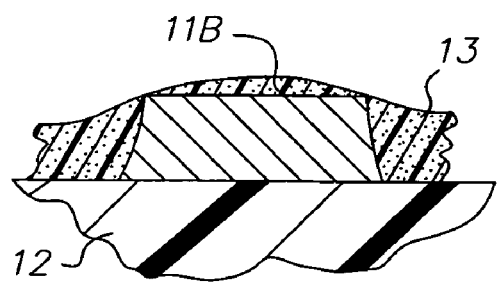

In FIGS. 1A and 1B, there are shown two examples of different height circuit elements 11A and 11B, which may be found within (e.g., as part of a conductive layer) and upon the surface of a typical circuitized substrate 12 such as a printed circuit board (PCB) or chip carrier. These elements, which, as stated, may be in the form of a signal line, a pad, or even the lands on a plated through hole (PTH), are typically of the same height per substrate, depending on the parameters (e.g., circuit density, number of lines, etc.) of the finished product. FIGS. 1A and 1B are intended to show that some products require elements which may be higher (or taller) than others, the element 11B obviously being the taller of the two. In one example, a normal height element may have a height of two mils (a mil being 1/1000 of an inch) while taller elements may be as high as about five mils. Typically, solder mask material 13 is applied in liquid form onto such substrates as a single layer using conventional screening, all in a single pass operation. A typical screen through which the mask material is dispensed may be a "92 mesh" polyester screen consisting of 100-micron wires and 180 micron nominal openings. Such screens are known in the art. While the coverage of the single layer (typically 0.3 mils thick) of solder mask material often adequately covers the conventional height elements such as element 11A, occasionally it fails to do so for taller elements such as element 11B. As such, the upper edges of the element (especially that to the left in FIG. 1B) may receive little or no covering of the mask material, resulting in plating defects during the following plating and/or soldering operations to which the substrate is subjected. Other defects may include increased staining, blistering, "haloing" and pinholes.

Figure 2:
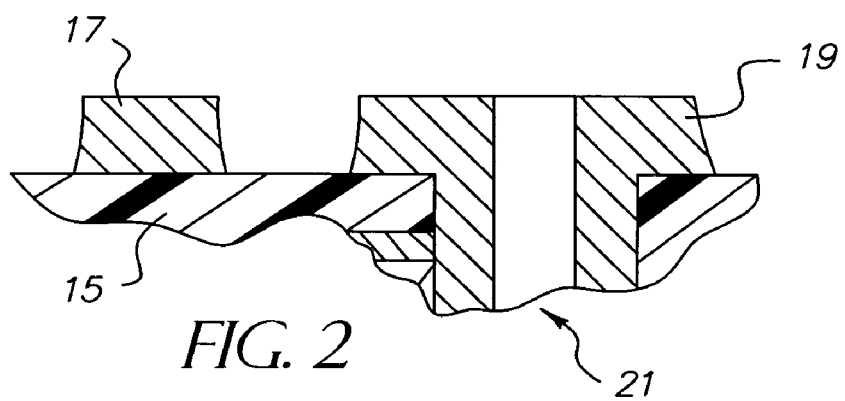
FIGS. 2-6 represent the steps of making a circuitized substrate according to one embodiment of the invention.

In FIG. 2, there is shown a first step in a method of making a circuitized substrate which will substantially eliminate the aforementioned defects. There is shown in FIG. 2 a substrate 15 preferably comprised of one of the above-identified dielectric materials (e.g., "FR-4" dielectric) with circuit elements 17 and 19 thereon. Element 17 may be a circuit line or pad while element 19 may be the upper land portion of a PTH, the remaining part of this structure (the "barrel" 21) projecting downwardly within the substrate as is known. PTH's are known and extend through a layer of dielectric to the other side on which may also be formed lands such as those shown in FIG. 2. Such illustration is thus not deemed necessary here. In a circuitized substrate of many dielectric layers, such PTH's may extend only a predetermined depth within the substrate and it is also possible for various internal such conductive through holes to be formed. In the case of the latter, such conductive holes are often referred to as "buried vias" while holes that extend only partly within the substrate are referred to as "blind vias." A conductive hole which extends through the entire substrate thickness is referred to as a PTH. It is to be understood that the teachings herein relate to the application of solder mask material onto the outer surfaces of substrates which include circuit elements of the type defined above thereon. In many cases, such substrates will include two opposing surfaces, each having circuit elements. In the broader aspects of the invention, however, the teachings may apply to only the application of solder mask material to a single side of a substrate.

Circuit elements such as elements 17 and 19 are typically copper, as mentioned above, but may be of different metallurgies. Each may be applied onto the dielectric by conventional means such as electroplating. It is also possible to form circuit lines and/or pads by the bonding of a layer of thin copper onto the dielectric and thereafter subjecting the copper to conventional photolithographic processing in which selected areas of the copper are removed (usually via etching) to define the resulting desired pattern of elements. PTH's are conventionally formed by initially drilling (e.g., using laser or mechanical drills) holes within the final dielectric thickness and then plating the surfaces of the openings and portions of the upper and lower surfaces of the dielectric, the latter resulting in the defined "lands." It is to be understood that formation of the circuit elements shown herein may occur using conventional means. Further definition is not considered necessary, therefore. In one example, the circuitry formed on the substrate may include circuit lines having a width of only about two mils and heights of only about one mil, these lines being spaced only two mils apart. Such close spacing and extremely small dimensions thus represent examples of the high density of such patterns which may be treated using the teachings herein. In a further example, as many as 10,000 PTH's per square inch have been successfully treated.

While FIG. 2 shows an element 17 which may be a line (in cross section) or a pad (also in cross section), and element 19 as a PTH, it is understood that the invention's teachings are applicable to circuit patterns of many combinations of such structures, including patterns with only lines and/or pads and patterns of only PTH's. The elements of FIG. 2 are thus provided for illustration purposes and not meant to limit this invention.

Figure 3:
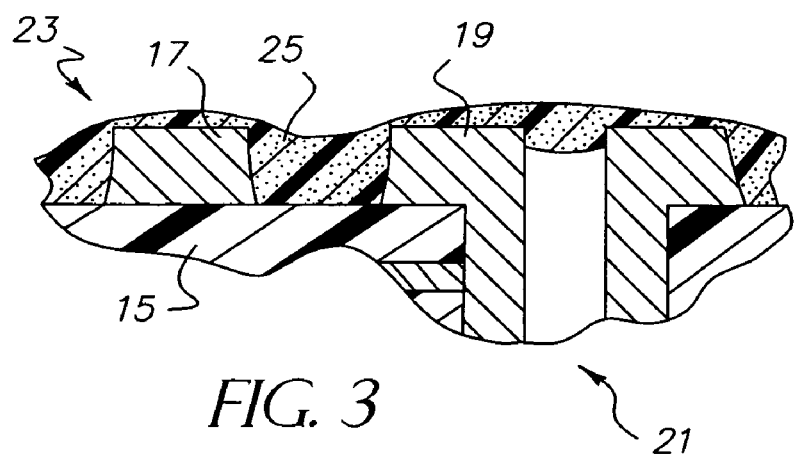

In FIG. 3, a first thin layer 23 of photoimageable solder mask material 25 is applied onto substrate 15, in liquid form, and over circuit elements 17 and 19. Layer 23 is dispensed using conventional (except for the mask) liquid dispensing equipment used in PCB manufacturing, and, in one example, may possess a thickness of about two mils (depending on line height) at its thickest dimension (e.g., between elements 17 and 19). The corresponding thickness over each element is only from about six microns to about nine microns. Significantly, the solder mask material is dispensed through a fine mask and in this embodiment, one of 195 mesh (see below). A preferred solder mask material is a liquid photoimageable (LPI) solder mask material sold under the product name "PSR4000BN" by Taiyo America, having a place of business in Carson City, Nev. This particular material has a viscosity range of about 175-225 ps, which is considered important for this particular application in order to properly fill in all minute openings as might occur adjacent the high density circuit elements defined herein. The invention is not limited to this particular material, however, as other LPI materials are possible.

The mask used for this first application of solder mask material is also used for the second application, defined below, thereby expediting material application. In the above embodiment, the mask is a pre-stretched woven monofilament polyester mesh mask sold by Sefar America under the product name "PeCap LE 195-55." Sefar America has a place of business in Depew, N.Y. Significantly, this particular mask has much smaller openings than those used in the above described "92 mesh" mask conventionally used in applying only a singular LPI layer, with wire (thread) diameters of only about fifty-five microns, nominal mesh openings of only about seventy-four microns, and an overall thickness of only about one hundred and five microns. The invention is not limited to this particular mask and mask properties, as others are possible.

Material 25 may be applied in various ways, depending on the substrate being treated and the operating equipment used. In one example, if a substrate with circuitry only on one side is to be treated, the material is obviously only applied on the side having the circuitry. If a substrate has dual side circuitry (circuit elements on opposite sides), material application may occur in one of two ways, sequentially or simultaneously. In the former, a first layer 23 is applied onto the elements on the first side, followed by a second layer (described below) over the first layer. The other side of the substrate may then be treated, applying the first layer and then the second. In a simultaneous application, first layers are applied over elements on both opposing sides and second layers then applied in a likewise manner. The invention is thus adaptable to different approaches.

First layer 23 is "tack dried" in a convection oven at from about 160 degrees Fahrenheit (F) to about 180 degrees F. for a time period of about ten to about twenty-five minutes. In a more preferred example, the drying occurs for about fifteen to about twenty minutes at 180 degrees F. These parameters are for the application of the solder mask material to only one side of the substrate. If a dual sided, simultaneous application were to occur (both first layers simultaneously), the "tack drying" would occur in the oven for a period of about forty to about fifty minutes at a temperature in the range of about 150 degrees F. to about 170 degrees F. In a more preferred example of this dual sided material application, the drying occurs for about forty-five minutes at 160 degrees F.

Figure 4:
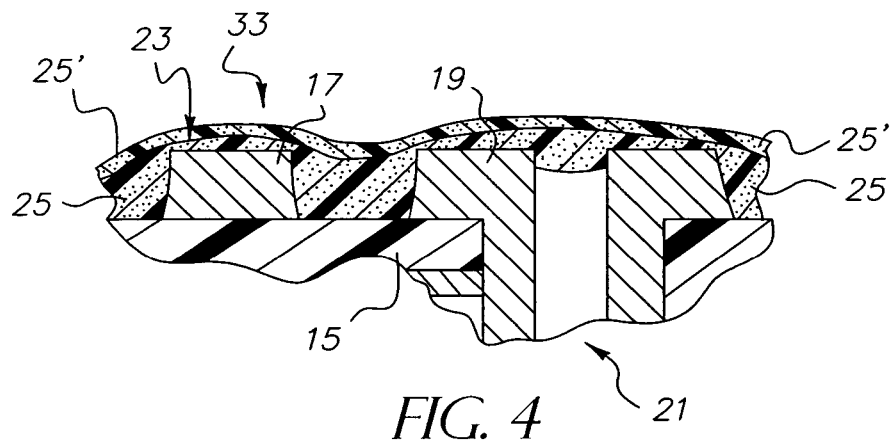

In FIG. 4, a second layer 33 of LPI material 25' is applied, using the same mask as above, and at an added six micron to nine micron thickness over each of the elements 17 and 19 (bringing the full thickness over these elements to about twelve microns to about eighteen microns and a total maximum thickness (e.g., between elements) of the material to about three mils. (The drawings are thus clearly not exactly to scale, and are primarily to illustrate simply both layers being applied. Significantly, however, the edges of the circuit elements are more fully covered in comparison to the lesser coverage, if any, afforded by the application of the known single layer described above.) In a preferred embodiment, the same solder mask material used for layer 23 is used, although this is not meant to limit the invention because other LPI materials may be used. As with layer 23, second layer 33 is "tack dried" in a convection oven. The preferred drying times and temperature ranges differ, however, depending on the manner of application. If a sequential application, where a first layer is applied to a first side and then a second layer applied thereover, the preferred parameters used are temperatures from about 160 degrees Fahrenheit (F) to about 180 degrees F. for a time period of about ten to about twenty-five minutes. In a more preferred example, this particular drying occurs for about fifteen to about twenty minutes at 180 degrees F. Again, these parameters are for the application of the layer 33 of solder mask material to only one side of the substrate (and thus over only a first layer already "tack dried" and in place on said first side). If a dual sided application were to occur, including where this second layer is simultaneously applied onto two first layers already tack dried and in place on their respective sides of the substrate, the "tack drying" would occur in the oven for a period of about forty to about fifty minutes at a temperature in the range of about 150 degrees F. to about 170 degrees F. In a more preferred example of this dual sided material application, the drying of both second layers 33 occurs for about forty-five minutes at 160 degrees F. In the case where sequential application occurs (a first layer and then a second on one side, followed by a first and then a second on a second side), even different parameters are preferably used. Specifically, the first and second layers are "tack dried" as defined above (e.g., fifteen to twenty minutes at 180 degrees F. per layer), and the first layer on the second side is similarly dried (at fifteen to twenty minutes for 180 degrees F., with the similar broader ranges applicable). Significantly, however, the second layer applied on the second side is "tack dried" at different parameters. In the particular example immediately above, this "second" second layer is dried in the convection oven for a period of fifty-five to about seventy minutes, at a temperature within the range of about 160 degrees F. to about 180 degrees F., and in a more particular embodiment, for sixty to about sixty-five minutes for about 180 degrees F. This is notably longer and at a higher temperature than the method where the first layers are applied on opposite sides simultaneously and then the second layers likewise applied there-over. Additionally, in one instance, "batch" drying is used compared to the use of conveyor drying for the other parts.

Drying only to the "tack dried" phase and not fully drying (or curing) of the LPI material in the manner defined herein is considered important because "tack" drying the first layer but not curing it allows the second layer to bond especially well to the first layer while the bulk of the first layer remains unaffected by the deposition of the second layer. Of further significance, the resulting layers of solder mask material are intended to remain on the final product (see below) and are thus what may be referred to as being permanent. This eliminates the need for a subsequent removal process in which the material is removed, thereby saving time and cost for the process defined herein.

Figure 5:
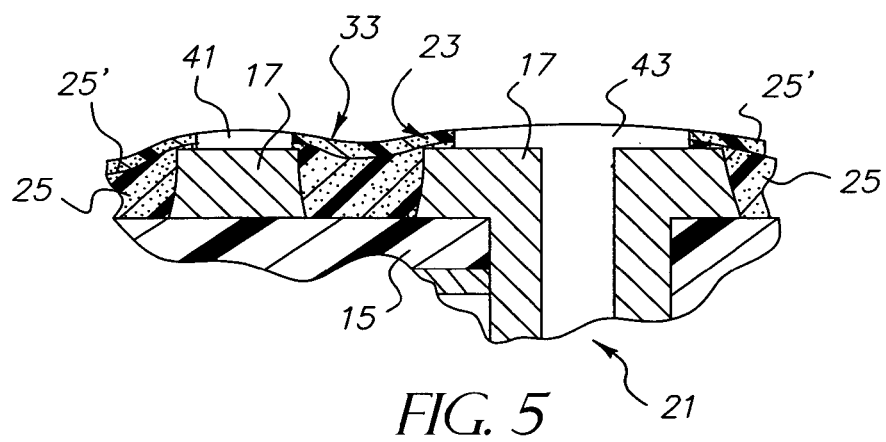

With the second layer(s) 33 in place, and "tack" drying having occurred, the substrate is then subjected to conventional expose and develop processing conventionally used in photoimaging of solder mask materials of this type, the result being the removal of pre-established, finely defined parts of mask material from over the respective circuit elements to thereby expose precise, selected portions of the upper surfaces of such elements. This is shown in FIG. 5, where openings (or holes) 41 and 43 are formed within both layers 23 and 33. Thereafter, the substrate is subjected to a thermal cure step in which the substrate is heated to a temperature of from about 295 degrees F. to about 305 degrees F. for a time period of from about fifty minutes to about seventy minutes. The effect of this is to finally and fully cure the LPI material from its "tack dried" phase. The applied LPI material thus serves to define the precise surface locations on which subsequent operations will be performed (see below).

Figure 6:
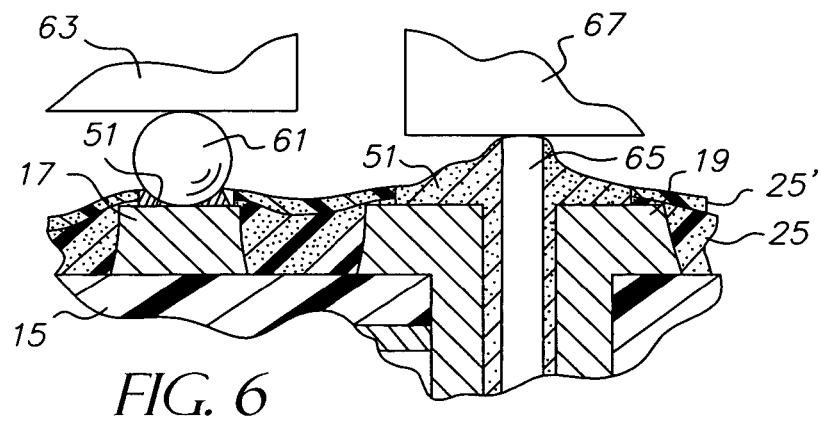

In FIG. 6, the substrate 15 and its cured solder mask material, permanently in position as shown, is then preferably subjected to a surface finishing step in which the exposed surfaces of the elements 17 and 19 are covered with an extremely thin layer of film (not shown in the drawings because it is so thin, and is optional). In one example, an organic solderability preservative may be applied, one such material being "Entek Plus HT", sold by Enthone Inc., a business of Cookson Electronics and having a business location in West Haven, Conn. As part of this process, a cleaner (e.g., "Entek Cleaner SC-1010DE") removes trace contaminates on the element surfaces and then wets these surfaces. An etchant (e.g., "Entek Microetch ME-1020") may then be used to enhance the surface topography, followed by a rinse step to rinse the etched metal surfaces. Next, a "precoat" material (e.g., "Entek Precoat PC-1030") may be used to prepare the exposed surfaces for a more stable, reliable coating. Finally, a finish coating (e.g., "Entek PLUS CU-106A(X) HT") is applied at a low pH to ensure a consistent, highly stable final finish. The above multi-step process was developed by Enthone, Inc. for use with the defined Entek components. Other processes, including those which do not use an organic solderability preservative, may be used, including an electroless plating process which deposits two extremely thin layers of nickel and gold, an immersion process which deposits a fine layer of tin, and an immersion process which deposits a fine layer of silver. The invention is thus not limited to any particular process of these optional steps to treating the surfaces of the exposed elements 17 and 19.

With the above accomplished, elements 17 and 19 are ready to receive desired quantities of solder 51, as seen also in FIG. 6. Solder 51 may be applied in paste form, using conventional paste dispensing apparatus. Alternatively, the solder may be applied using Hot Air Solder Leveling (HASL) or electrolytic solder plating. The solder 51 applied relative to element 17 need only cover the exposed surface thereof and is particularly adapted for thereafter receiving a solder ball 61 which may serve to connect element 17 to a semiconductor chip 63 or even a larger chip carrier, if these electronic components use such solder balls for such connections. Such solder balls 61 are typically reflowed (heated to a predetermined melting point) when in position on the underlying substrate. This solder may also receive a metal lead (not shown) or the like, such as used in many electronic components. Understandably, such components include a plurality of such leads or solder balls to provide the needed connections, and the underlying substrate as taught herein may include as many receiving pads or the like circuit elements designed to couple to same. In a similar manner, the solder 51 deposited around element 19 substantially fills the hole and is thus adapted for receiving a pin 65 within the hole, such a pin commonly used in many electronic components, the one in FIG. 6 being referenced by the numeral 67. As with solder balls or leads, many such pins are typically utilized, and the substrate taught herein is readily adapted for accommodating same, regardless of number. It is also understood that the substrate of the instant invention is adapted for receiving a combination of solder balls, leads and pins, depending on the operational requirements of the desired end product (circuitized substrate assembly).

Figure 7:
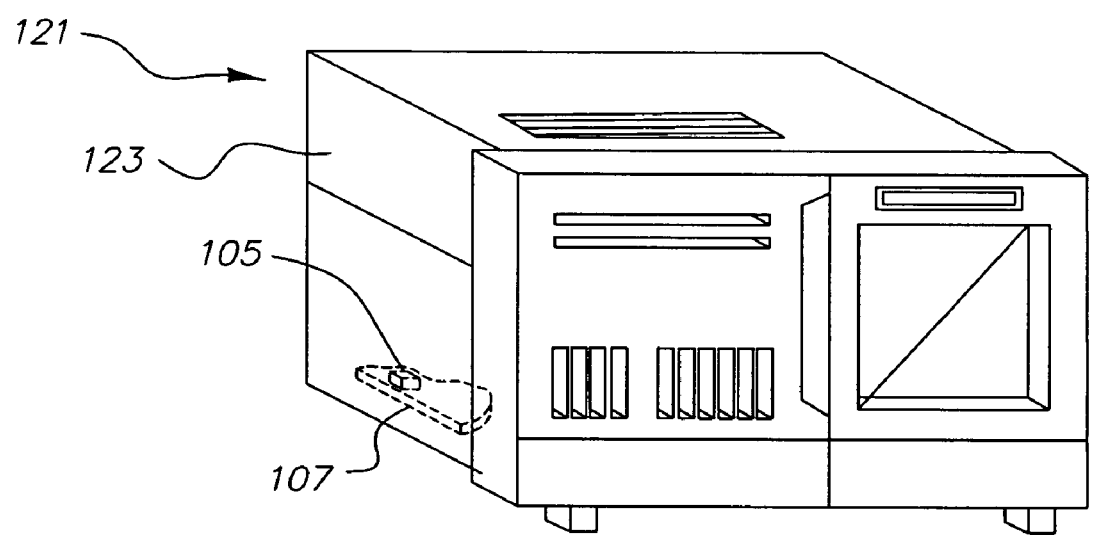
FIG. 7 is a perspective view of an information handling system adapted for utilizing one or more of the circuitized substrate assemblies as taught herein.

In FIG. 7, there is shown an information handling system 121 in which the assembly (substrate with one or more electronic components) described above may be utilized. By way of example, system 121 may be a server (as shown), a personal computer, mainframe or similar information handling system known in the art. It is well-known in the information handling systems art that these structures often include circuit boards and other circuitized substrates as part thereof. In the instant invention, system 121 is shown to include a housing 123 of conventional construction and is also shown as including an assembly 105 of the invention positioned therein, e.g., upon a "motherboard" substrate 107 as are known in such systems. In this particular case, assembly 105 may be a chip carrier positioned on a substrate as shown in FIG. 6, a circuit board having various components mounted thereon, or another assembly possible using the teachings herein. If a "motherboard" is used, it in turn is electrically coupled to other components of the system as known. The positioning relationship of assembly 105 is for illustration purposes only in that this assembly can also be located at other locations within the system, including substantially perpendicular to the orientation shown. It is also understood that several such assemblies may be utilized in such a system, depending on the operational requirements thereof. If the system is a computer, server, mainframe or the like, it will include a central processing unit (CPU), one or more input/output (I/O) devices, and one or more random access storage devices, all of which are known in the art and further description is not needed. Such added devices and supporting components are also not shown in FIG. 7, for ease of illustration. System 121 may also include various peripheral devices functionally operable therewith, including keyboards, mice, displays, printers, speakers and modems. The components, including positioning thereof within or in operational relationship to a computer, server, mainframe, etc., are also well known in the art and further description not deemed necessary.

Thus there has been shown and described a new and unique process for making a circuitized substrate which assures highly precise exposure of high density patterns of various circuit elements and which can be accomplished in a relatively facile manner, using conventional PCB equipment or the like, and, particularly, fine mesh screens for depositing extremely fine layers of the LPI material used. The resulting products, e.g., PCB's or chip carriers, may then be utilized as part of larger systems, including information handling systems of the type defined herein.

While there have been shown and described what are at present considered the preferred embodiments of the invention, it will be obvious to those skilled in the art that various changes and modifications may be made therein without departing from the scope of the invention as defined by the appended claims.

What is claimed is:

1. A circuitized substrate assembly comprising:
a substrate including a first surface and at least one through hole having predetermined dimensions;
circuit elements on said first surface of said substrate;
a first thin layer of liquid permanent photoimageable solder mask material disposed in said at least one through hole on said first surface of said substrate, said first thin layer of solder mask being tack dried at a first predetermined temperature for a first predetermined period of time for drying solvent and cleaning said solder mask material, and defining a first plurality of openings therein which expose parts of said circuit elements;
a second thin layer of liquid permanent photoimageable solder mask material subsequently being positioned directly over said first thin layer of permanent photoimaged solder mask material to help eliminate volatiles from said first solder mask, whereby said first and second layers of solder mask do not sacrifice adhesion to said circuit elements, said second thin layer of solder mask being tack dried at a second predetermined temperature for a second predetermined period of time, and defining a second plurality of openings;
a solder element secured to selected ones of said exposed parts of said circuit elements; and
an electronic component electrically coupled to selected ones of said solder elements so as to electrically couple said electronic component to said selected ones of said circuit elements.

2. The circuitized substrate assembly of claim 1 wherein said first and second thin liquid layers comprise-substantially identical solder mask material.

3. The circuitized substrate assembly of claim 1 wherein said circuit elements comprise plated through holes, circuit pads, or lines.

4. The circuitized substrate assembly of claim 3 wherein said circuit elements comprise circuit pads and said solder element comprises a solder ball, said electronic component being a semiconductor chip.

5. The circuitized substrate assembly of claim 3 wherein said circuit elements comprise circuit pads and said solder element comprises a solder ball, said electronic component being a chip carrier.

6. The circuitized substrate assembly of claim 3 wherein said circuit elements comprise plated through holes and said solder element comprises a quantity of solder each within selected ones of said plated through holes.

7. The circuitized substrate assembly of claim 6 wherein said electronic component comprises a pinned component having a plurality of pins projecting therefrom, selected ones of said pins being positioned within selected ones of said plated through holes and electrically coupled to a respective one of said quantities of solder.

8. An information handling system (IHS) comprising:
a) a housing; and
b) a circuitized substrate assembly positioned within said housing, said circuitized substrate assembly including a substrate comprising:
i) a first surface and at least one through hole therein having predetermined dimensions;
ii) circuit elements on said first surface of said substrate;
iii) a first thin layer of liquid permanent photoimageable solder mask material disposed in said at least one through hole, said first thin layer of solder mask being tack dried at a first predetermined temperature for a first predetermined period of time for drying solvent and cleaning said solder mask material to help eliminate volatiles from said first solder mask, whereby said first and second layers of solder mask do not sacrifice adhesion to said circuit elements, and defining a first plurality of openings therein which expose parts of said circuit elements;
iv) a second thin layer of liquid permanent photoimageable solder mask material subsequently being aligned and positioned directly over said first thin layer of permanent photoimaged solder mask material, said second thin layer of solder mask being tack dried at a second predetermined temperature for a second predetermined period of time, and defining a second plurality of openings; and v) solder elements secured to selected ones of said exposed parts of said circuit elements, and an electronic component electrically coupled to selected ones of said solder elements so as to electrically couple said electronic component to said selected ones of said circuit elements.

9. The IHS of claim 8 wherein said information handling system forms a personal computer.

10. The IHS of claim 8 wherein said information handling system forms a mainframe computer.

11. The IHS of claim 8 wherein said information handling system forms a computer server.

* * * * *